(12) United States Patent
Liu et al.

(10) Patent No.: US 12,604,426 B2
(45) Date of Patent: Apr. 14, 2026

(54) COVER PLATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Shaokui Liu, Beijing (CN); Zhihui Wang, Beijing (CN); Danping Shen, Beijing (CN); Wei Zeng, Beijing (CN); Qiang Tang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 310 days.

(21) Appl. No.: 17/908,644

(22) PCT Filed: Nov. 3, 2021

(86) PCT No.: PCT/CN2021/128419
§ 371 (c)(1),
(2) Date: Sep. 1, 2022

(87) PCT Pub. No.: WO2022/183757
PCT Pub. Date: Sep. 9, 2022

(65) Prior Publication Data
US 2024/0196554 A1 Jun. 13, 2024

(30) Foreign Application Priority Data
Mar. 5, 2021 (CN) .......................... 202110245878.1

(51) Int. Cl.
*H05K 5/03* (2006.01)
*B32B 7/022* (2019.01)
(Continued)

(52) U.S. Cl.
CPC ............... *H05K 5/03* (2013.01); *B32B 7/022* (2019.01); *B32B 7/12* (2013.01); *B32B 27/08* (2013.01);
(Continued)

(58) Field of Classification Search
CPC ........... B32B 7/02–7/022; B32B 27/00–27/44; G06F 1/00–1/3296
See application file for complete search history.

(56) References Cited

U.S. PATENT DOCUMENTS 10,216,230 B2 * 2/2019 Kim ...................... H10K 77/111
10,732,445 B2 * 8/2020 Shin ................... G02F 1/13338
(Continued)

FOREIGN PATENT DOCUMENTS

CN 103192558 A 7/2013
CN 104105598 A 10/2014
(Continued)

OTHER PUBLICATIONS

Machine translation of KR20190085327. Retrieved Aug. 30, 2024.*
(Continued)

*Primary Examiner* — Prashant J Khatri
(74) *Attorney, Agent, or Firm* — IPro, PLLC

(57) ABSTRACT

Provided is a cover plate. The cover plate includes a substrate, a first buffer layer and a second buffer layer. The substrate includes a first surface and a second surface, and the first surface faces a flexible display panel. The first buffer layer is laminated on the first surface, and an elastic modulus of the first buffer layer ranges from 10 MPa to 2 GPa. The second buffer layer is laminated on the second surface, and an elastic modulus of the second buffer layer ranges from 60 MPa to 7 GPa.

13 Claims, 5 Drawing Sheets

(51) Int. Cl.

| | |
|---|---|
| *B32B 7/12* | (2006.01) |
| *B32B 27/08* | (2006.01) |
| *B32B 27/28* | (2006.01) |
| *B32B 27/36* | (2006.01) |
| *B32B 27/40* | (2006.01) |

(52) U.S. Cl.
CPC ............ *B32B 27/281* (2013.01); *B32B 27/36* (2013.01); *B32B 27/40* (2013.01); *B32B 2255/10* (2013.01); *B32B 2255/26* (2013.01); *B32B 2274/00* (2013.01); *B32B 2307/51* (2013.01); *B32B 2307/54* (2013.01); *B32B 2307/584* (2013.01); *B32B 2307/7376* (2023.05); *B32B 2457/20* (2013.01)

(56) References Cited

U.S. PATENT DOCUMENTS

| | | | |
|---|---|---|---|
| 10,892,443 B2 * | 1/2021 | Ahn .................. | H10K 59/8722 |
| 2013/0177748 A1 | 7/2013 | Hirai et al. | |
| 2014/0050909 A1 | 2/2014 | Choi et al. | |
| 2015/0252212 A1 * | 9/2015 | Kang ...................... | C08J 7/043 |
| | | | 428/209 |

| | | | |
|---|---|---|---|
| 2017/0028677 A1 * | 2/2017 | Lee ...................... | B32B 27/281 |
| 2018/0088392 A1 | 3/2018 | Park et al. | |
| 2019/0315099 A1 * | 10/2019 | Baby ...................... | C03C 17/30 |

FOREIGN PATENT DOCUMENTS

| | | | | |
|---|---|---|---|---|
| CN | 107610595 | A | | 1/2018 |
| CN | 107867030 | A | | 4/2018 |
| CN | 108877529 | A | | 11/2018 |
| CN | 208271483 | U | | 12/2018 |
| CN | 113035065 | A | | 6/2021 |
| KR | 20190085327 | A | * | 7/2019 |
| WO | 2021003740 | A1 | | 1/2021 |

OTHER PUBLICATIONS

Garey et al. "New Developments in Aliphatic Polyurethanes", Journal of Elastomers and Plastics, vol. 20, (1988); pp. 46-53.*
Paulson et al. "Industrial-grade anti-reflection coatings with extreme scratch resistance", Optics Letters, vol. 44, No. 24, (2019); pp. 5977-5980.*
CN202110245878.1 first office action.
CN202110245878.1 second office action.

* cited by examiner

100

100

100

100

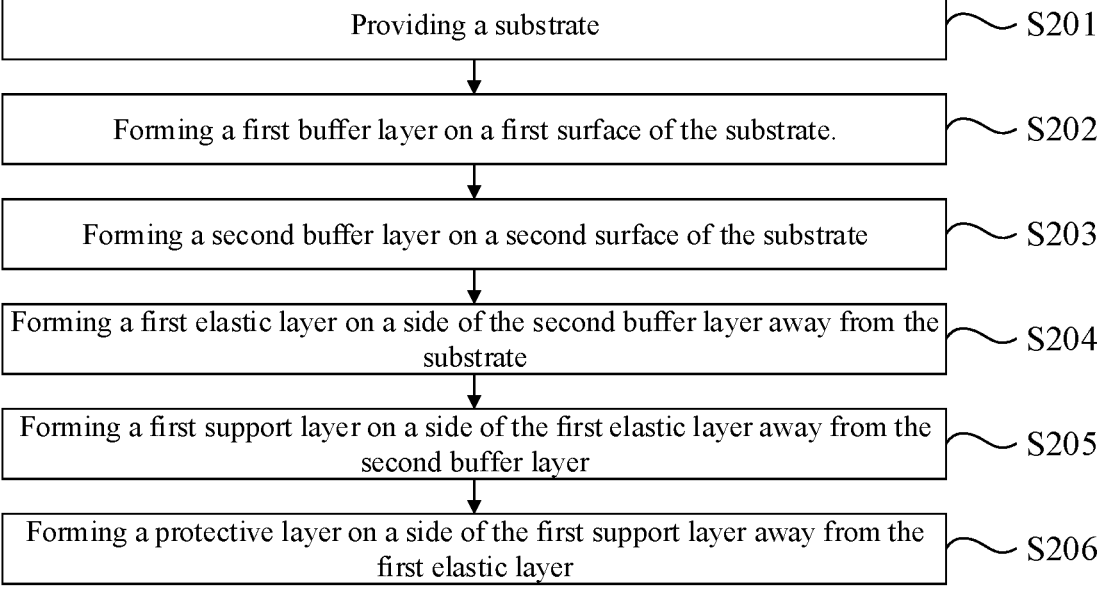

| | |
|---|---|
| Providing a substrate | S201 |
| Forming a first buffer layer on a first surface of the substrate. | S202 |
| Forming a second buffer layer on a second surface of the substrate | S203 |
| Forming a first elastic layer on a side of the second buffer layer away from the substrate | S204 |
| Forming a first support layer on a side of the first elastic layer away from the second buffer layer | S205 |
| Forming a protective layer on a side of the first support layer away from the first elastic layer | S206 |

FIG. 8

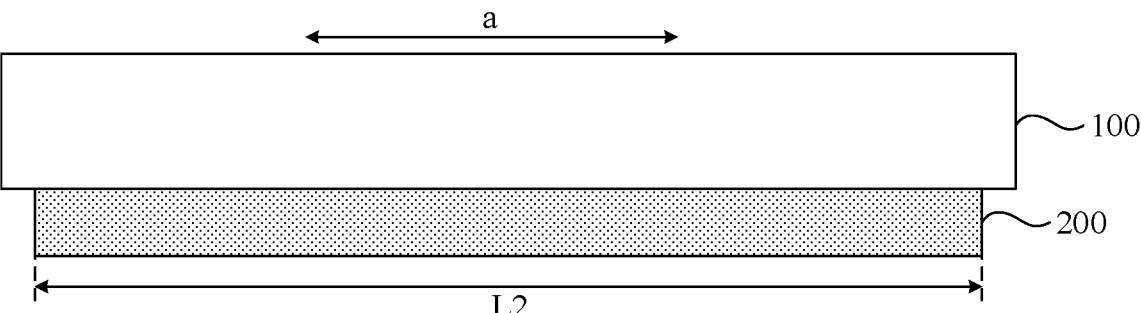

COVER PLATE AND DISPLAY DEVICE

CROSS-REFERENCE TO RELATED APPLICATION

The present disclosure is a U.S. national stage of international application No. PCT/CN2021/128419, filed on Nov. 3, 2021, which claims priority to Chinese Patent Application No. 202110245878.1, filed on Mar. 5, 2021, and entitled "COVER PLATE AND DISPLAY DEVICE", the contents of which are incorporated herein by reference in their entireties.

TECHNICAL FIELD

The present disclosure relates to the field of displays, and in particular relates to a cover plate and a display device.

BACKGROUND

Foldable display devices are more and more widely used in the display field, and users can adjust the size of a screen of the foldable display device according to actual needs. The foldable display device includes a flexible display panel (PNL) and a cover plate (Cover Window), and the cover plate is disposed on the flexible display panel to protect the flexible display panel.

SUMMARY

Embodiments of the present disclosure provides a cover plate and a display device. The technical solutions are as follows.

According to some embodiments of the present disclosure, a cover plate is provided. The cover plate is applicable to a flexible display panel and includes: a substrate including a first surface and a second surface opposite to each other, the first surface facing the flexible display panel: a first buffer layer laminated on the first surface, wherein an elastic modulus of the first buffer layer ranges from 10 MPa to 2 GPa; and a second buffer layer laminated on the second surface, wherein an elastic modulus of the second buffer layer ranges from 60 MPa and 7 GPa.

In some embodiments of the present disclosure, the first buffer layer is any one of a flexible polyurethane (PU) layer, a polyimide (PI) layer, and a polymethyl methacrylate (PMMA) layer, or the first buffer layer is formed by laminating at least two of the flexible PU layer, the PI layer and the PMMA layer; and the second buffer layer is any one of the flexible PU layer, the PI layer and the PMMA layer, or the second buffer layer is formed by laminating at least two of the flexible PU layer, the PI layer and the PMMA layer.

In some embodiments of the present disclosure, in a direction perpendicular to the first surface, a thickness of the first buffer layer ranges from 5 μm to 40 μm, and a thickness of the second buffer layer ranges from 5 μm to 40 μm.

In some embodiments of the present disclosure, the cover plate further includes: a first elastic layer, laminated on a side of the second buffer layer away from the substrate.

In some embodiments of the present disclosure, the first elastic layer is a thermoplastic polyurethane (TPU) layer.

In an implementation of the embodiments of the present disclosure, the cover plate further includes: a first support layer laminated on a side of the first elastic layer away from the substrate (10).

In some embodiments of the present disclosure, the first support layer is a polyethylene terephthalate (PET) layer.

In some embodiments of the present disclosure, the cover plate further includes: a protective layer laminated on the side of the second buffer layer away from the substrate, wherein the protective layer is an outermost layer among all layers on the side of the second buffer layer away from the substrate; and a first adhesive layer adhered between the protective layer and a layer adjacent to the protective layer.

In some embodiments of the present disclosure, the protective layer includes: a second support layer laminated on a side of the first adhesive layer away from the substrate; and a scratch-resistant layer laminated on a side of the second support layer away from the substrate.

In some embodiments of the present disclosure, when temperature ranges from 15° C. to 35° C., a viscosity of the first adhesive layer is greater than 700 gf/inch, a creep coefficient of first adhesive layer is greater than 300%, and a restitution coefficient of the first adhesive layer is greater than 80%; and when the temperature is less than −50° C., the viscosity of the first adhesive layer is less than 30 gf/inch.

According to some embodiments of the present disclosure, a display device is provided. The display device includes a cover plate and a flexible display panel laminated in sequence. The cover plate is any one of the cover plates described in the above aspect.

In some embodiments of the present disclosure, the display device further includes: a second elastic layer laminated on a side of the flexible display panel away from the cover plate, wherein a tensile strength of the second elastic layer ranges from 5 MPa to 10 MPa.

In some embodiments of the present disclosure, the second elastic layer is any one of a thermoplastic polyurethane (TPU) elastomer rubber layer, a foam layer, a polyethylene terephthalate (PET) layer, a polyimide (PI) layer, and an optically clear adhesive (OCA) layer; or the second elastic layer is formed by laminating at least two of the (TPU) elastomer rubber layer, the foam layer, the (PET) layer, the PI layer, and the OCA layer.

In some embodiments of the present disclosure, along a first direction, a length of the cover plate is greater than a length of the flexible display panel. The first direction is perpendicular to an extension direction of a bending line when the display device is bent, and the first direction is parallel to the first surface.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

FIG. 8 is a flowchart of a method for manufacturing a cover plate according to some embodiments of the present disclosure:

FIG. 9 is a schematic sectional diagram of a display device according to some embodiments of the present disclosure.

DETAILED DESCRIPTION

To make the objectives, technical solutions, and advantages of the present disclosure clearer, the embodiments of the present disclosure will be further described in detail below with reference to the accompanying drawings.

In some ways, the cover plate includes a substrate and buffer layers disposed on opposite sides of the substrate. The substrate and the buffer layers have good flexibility, which facilitates folding of the foldable display device. However, the ultra-thin glass and buffer layer have low strength and are easily damaged when the cover plate is squeezed or impacted.

Figure 1:
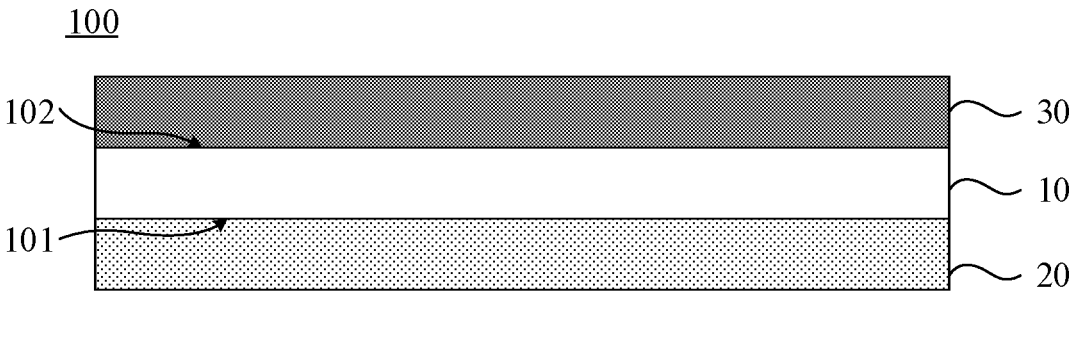
FIG. 1 is a schematic sectional diagram of a cover plate according to some embodiments of the present disclosure.

FIG. 1 is a schematic sectional diagram of a cover plate according to some embodiments of the present disclosure. Referring to FIG. 1, the cover plate 100 includes a substrate 10, a first buffer layer 20 and a second buffer layer 30. The substrate 10 has a first surface 101 and a second surface 102 opposite to each other. The first buffer layer 20 is laminated on the first surface 101 of the substrate 10, and the second buffer layer 30 is laminated on the second surface 102 of the substrate 10. The first surface 101 faces a flexible display panel. An elastic modulus of the first buffer layer 20 ranges from 10 MPa to 2 GPa, and an elastic modulus of the second buffer layer 30 ranges from 60 MPa to 7 GPa.

It should be noted that the elastic modulus is a ratio of stress to strain of a material under stress. The larger the elastic modulus of the material, the stronger the ability of the material to resist elastic deformation, that is, the stronger the rigidity and the weaker the elasticity of the material. The smaller the elastic modulus of the material, the weaker the ability of the material to resist elastic deformation, that is, the weaker the rigidity and the stronger the elasticity of the material.

In the embodiments of the present disclosure, the first buffer layer 20 is disposed on the first surface 101 of the substrate 10, and the second buffer layer 30 is disposed on the second surface 102 of the substrate 10. In this way, when the two surfaces of the cover plate 100 are impacted, both the first buffer layer 20 and the second buffer layer 30 can deform to absorb stress, so as to protect the substrate 10, thereby increasing the strength of the cover plate 100 and reducing the possibility of damage to the cover plate 100. The elastic modulus of the first buffer layer 20 ranges from 10 MPa to 2 GPa, that is, the first buffer layer 20 has relatively good elasticity. The first surface 101 faces the flexible display panel, that is, the first buffer layer 20 with good elasticity faces the flexible display panel. Therefore, the protection effect of the first buffer layer 20 on the flexible display panel can be increased. The elastic modulus of the second buffer layer 30 ranges from 60 MPa to 7 GPa, that is, the second buffer layer 30 has relatively good rigidity, such that the second buffer layer 30 has relatively strong strength. Therefore, when the cover plate 100 is impacted, the amount of strain transferred to the substrate 10 can be reduced, thereby further reducing the possibility of damage to the cover plate 100.

After the cover plate 100 is manufactured, a pen drop test or a ball drop test is conducted on the cover plate 100. In the test, a pen or a ball with certain weight is dropped at a certain height from the cover plate 100, and the pen or ball makes a free-fall motion and impacts on the cover plate 100. Then, the performance of the cover plate 100 after being impacted is detected to determine whether the cover plate 100 is qualified. In the embodiments of the present disclosure, both surfaces of the cover plate 100 are provided with buffer layers, which can reduce the possibility of damage to the cover plate 100 when the pen drop test or ball drop test is conducted on the cover plate 100, thereby improving the qualified rate of the cover plate 100.

In the embodiments of the present disclosure, the weight of the pen or ball ranges from 10 g to 15 g, and the height in the pen drop test or the ball drop test ranges from 20 cm to 30 cm, which can ensure the reliability of the pen drop test or ball drop test.

In some embodiments, the weight of the pen or ball is 13 g, and the height in the pen drop test or ball drop test is 25 cm.

In the embodiments of the present disclosure, the substrate 10 is ultra-thin glass (UTG), and the ultra-thin glass can be bent, rolled or folded to facilitate the folding of the flexible display panel. In addition, the ultra-thin glass is much thinner than common glass, which can reduce the thickness of the cover plate 100 and facilitate miniaturization of the device.

In the embodiments of the present disclosure, the ultra-thin glass refers to glass with a thickness ranging from 30 μm to 40 μm.

In the embodiments of the present disclosure, the first buffer layer 20 is disposed between the substrate 10 and the flexible display panel. Therefore, by setting the elastic modulus of the first buffer layer 20 to range from 10 MPa to 2 GPa, it is ensured that the first buffer layer 20 can deform greatly to absorb the stress when it's impacted, so as to protect the substrate 10 as well as the flexible display panel.

In some embodiments, the elastic modulus of the first buffer layer 20 is 50 MPa.

In an implementation of the embodiments of the present disclosure, the first buffer layer 20 is any one of a flexible polyurethane (PU) layer, a polyimide (PI) layer and a polymethyl methacrylate (PMMA) layer. The flexible polyurethane, polyimide and polymethyl methacrylate are all polymer coatings with relatively good elasticity, which can ensure the elastic modulus of the first buffer layer 20.

In another implementation of the embodiments of the present disclosure, the first buffer layer 20 is formed by laminating at least two of the flexible PU layer, the PI layer and the PMMA layer. For example, the first buffer layer 20 is formed by laminating the flexible PU layer and the PI layer.

In an implementation of the embodiments of the present disclosure, the thickness of the first buffer layer 20 ranges from 5 μm to 40 μm in the direction perpendicular to the first surface 101, which can not only ensure the elasticity of the first buffer layer 20 but also avoid the thickness of the cover plate 100 from being increased due to the large thickness of the first buffer layer 20.

In some embodiments, the thickness of the first buffer layer 20 is 20 μm.

In the embodiments of the present disclosure, the second buffer layer 30 is disposed on the second surface 102 of the substrate 10, that is, the second buffer layer 30 is disposed on the side of the substrate 10 away from the flexible display panel. Generally, the side, facing the second surface 102, of the substrate 10 is impacted first when the cover plate 100 is impacted. Therefore, by setting the elastic modulus of the second buffer layer 30 to range from 60 MPa to 7 GPa, the strength of the second buffer layer 30 can be ensured and the strain transferred to the substrate 10 can be reduced, thereby further reducing the possibility of damage to the cover plate 100.

In some embodiments, the elastic modulus of the second buffer layer 30 is 3 GPa.

In an implementation of the embodiments of the present disclosure, the second buffer layer 30 is any one of the flexible PU layer, the PI layer, and the PMMA layer. The flexible PU, PI and PMMA not only have elasticity but also have certain rigidity, which can ensure the strength of the second buffer layer 30.

In another implementation of the embodiments of the present disclosure, the second buffer layer 30 is formed by laminating at least two of the flexible PU layer, the PI layer and the PMMA layer. For example, the second buffer layer 30 is formed by laminating the flexible PU layer and the PI layer.

In an implementation of the embodiments of the present disclosure, the thickness of the second buffer layer 30 ranges from 5 μm to 40 μm in the direction perpendicular to the first surface 101, which can not only ensure the strength of the second buffer layer 30 but also avoid the thickness of the cover plate 100 from being increased due to the large thickness of the second buffer layer 30.

In some embodiments, the thickness of the second buffer layer 30 is 30 μm.

Figure 2:
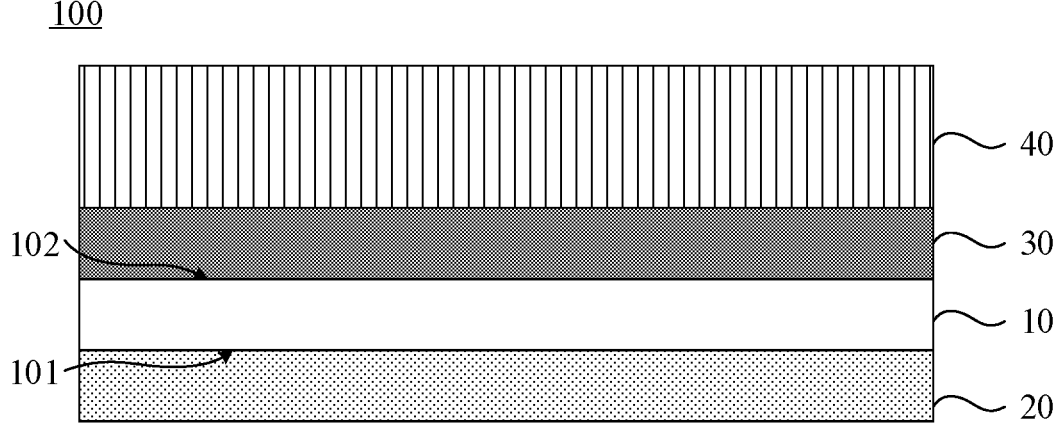
FIG. 2 is a schematic sectional diagram of a cover plate according to some embodiments of the present disclosure.

FIG. 2 is a schematic sectional diagram of a cover plate according to some embodiments of the present disclosure. Referring to FIG. 2, the cover plate 100 further includes a first elastic layer 40, and the first elastic layer 40 is laminated on the side of the second buffer layer 30 away from the substrate 10.

In the embodiments of the present disclosure, the first elastic layer 40 is disposed on the side of the second buffer layer 30 away from the substrate 10, that is, the first elastic layer 40 is disposed on a side facing the second surface 102 of the substrate 10. Generally, the side, facing the second surface 102, of the substrate 10 is impacted first when the cover plate 100 is impacted, that is, the first elastic layer 40 is impacted first, and the first elastic layer 40 deforms to absorb stress, thereby protecting the second buffer layer 30. Thus, the deformation of the second buffer layer 30 is reduced, such that the deformation transferred by the second buffer layer 30 to the substrate 10 is reduced and thus the deformation of the substrate 10 is reduced. As such, the strength of the cover plate 100 is increased, and the possibility of damage to the cover plate 100 is reduced. In addition, the first elastic layer 40 has relatively large elasticity, which can protect the second buffer layer 30 from damage in the pen drop test or ball drop test, thereby improving the protection effect on the ultra-thin glass.

In an implementation of the embodiments of the present disclosure, the first elastic layer 40 is a thermoplastic urethane (TPU) layer. The TPU has relatively good elasticity, which can ensure the elasticity of the first elastic layer 40.

In an implementation of the embodiments of the present disclosure, the thickness of the first elastic layer 40 ranges from 25 μm to 100 μm in the direction perpendicular to the first surface 101, which can not only ensure the strength of the first elastic layer 40 but also avoid the thickness of the cover plate 100 from being increased due to the large thickness of the first elastic layer 40.

In some embodiments, the thickness of the first elastic layer 40 is 75 μm.

Figure 3:
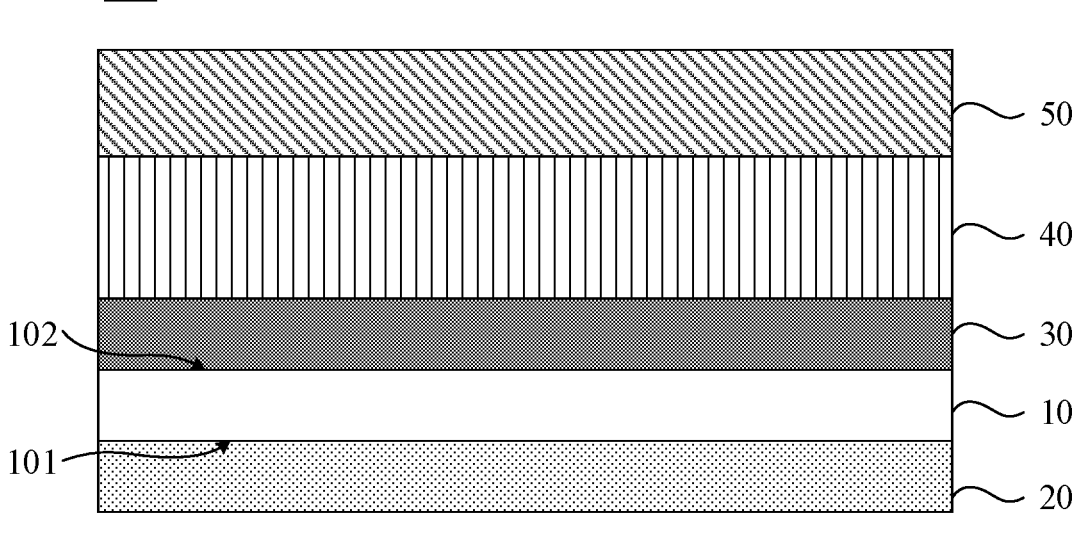
FIG. 3 is a schematic sectional diagram of a cover plate according to some embodiments of the present disclosure.

FIG. 3 is a schematic sectional diagram of a cover plate according to some embodiments of the present disclosure. Referring to FIG. 3, the cover plate 100 further includes a first support layer 50, and the first support layer 50 is laminated on the side of the first elastic layer 40 away from the substrate 10.

In the embodiments of the present disclosure, the first support layer 50 is disposed on the side of the first elastic layer 40 away from the substrate 10, that is, the first support layer 50 is disposed on the outside of the first elastic layer 40. When the cover plate 100 is impacted, the first support layer 50 is impacted first. The first support layer 50 has relatively strong rigidity, such that the first support layer 50 transfers less strain to the first elastic layer 40, that is, the deformation of the first elastic layer 40 is small. Thus, the strain transferred to the substrate 10 is reduced, and the possibility of damage to the substrate 10 is reduced. Therefore, the possibility of damage to the cover plate 100 is reduced. In addition, the strong rigidity of the first support layer 50 can increase the supportability of the cover plate 100 and ensure the shape of the cover plate 100.

In an implementation of the embodiments of the present disclosure, the first support layer 50 is a polyethylene terephthalate (PET) layer. The PET has relatively strong rigidity, which can ensure the rigidity of the first support layer 50.

In an implementation of the embodiments of the present disclosure, the thickness of the first support layer 50 ranges from 50 μm to 80 μm in the direction perpendicular to the first surface 101, which can not only ensure the strength of the first support layer 50 but also avoid the thickness of the cover plate 100 from being increased due to the large thickness of the first support layer 50. In some embodiments, the thickness of the first support layer 50 is 50 μm.

Figure 4:
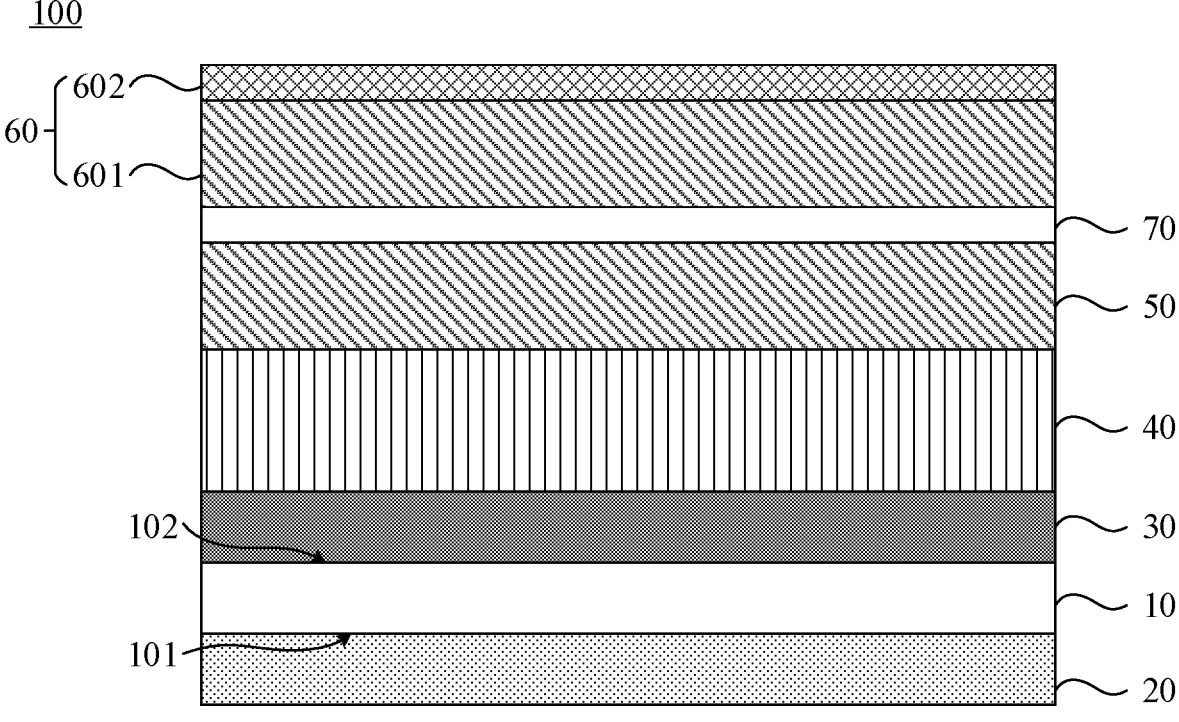
FIG. 4 is a schematic sectional diagram of a cover plate according to some embodiments of the present disclosure.

FIG. 4 is a schematic sectional diagram of a cover plate according to some embodiments of the present disclosure. Referring to FIG. 4, the cover plate 100 further includes a protective layer 60 and a first adhesive layer 70. The protective layer 60 is laminated on the side of the second buffer layer 30 away from the substrate 10, and the protective layer 60 is the outermost layer among all the layers on the side of the second buffer layer 30 away from the substrate 10. The first adhesive layer 70 is disposed between the protective layer 60 and a layer adjacent to the protective layer 60.

In the embodiments of the present disclosure, the protective layer 60 is disposed on the outermost side of the second buffer layer 30 away from the substrate 10, that is, the protective layer 60 is disposed on the outermost side of the cover plate 100. When the cover plate 100 undergoes bumps, the protective layer 60 undergoes bumps first. The protective layer 60 has relatively strong hardness, which can prevent scratches from forming on the surface of the cover plate 100. In addition, the strong rigidity of the protective layer 60 can increase the supportability of the cover plate 100 and ensure the shape of the cover plate 100. The first adhesive layer 70 is configured to adhere the protective layer 60 and the second buffer layer 30 to ensure the integrity of the cover plate 100.

In an implementation of the embodiments of the present disclosure, the thickness of the protective layer 60 ranges from 50 μm to 80 μm in the direction perpendicular to the first surface 101, which can not only ensure the strength of the protective layer 60 but also avoid the thickness of the cover plate 100 from being increased due to the large thickness of the protective layer 60. In some embodiments, the thickness of the protective layer 60 is 65 μm.

In an implementation manner of the embodiments of the present disclosure, the thickness of the first adhesive layer 70 ranges from 10 μm to 30 μm in the direction perpendicular to the first surface 101. The thickness of the first adhesive layer 70 is controlled, to prevent the thickness of the cover plate 100 from being increased due to the large thickness of the first adhesive layer 70. In some embodiments, the thickness of the first adhesive layer 70 is 15 μm.

In the embodiments of the present disclosure, the first adhesive layer 70 is an optically clear adhesive (OCA) layer. The OCA has relatively good adhesiveness, which can ensure the firmness of connection between the protective layer 60 and the second buffer layer 30.

Alternatively, in other implementations, the first adhesive layer 70 is a pressure-sensitive adhesive (PSA) layer.

In the embodiments of the present disclosure, when the temperature ranges from 15 degrees Celsius (° C.) to 35° C., the viscosity of the first adhesive layer 70 is greater than 700 gf/inch.

In the embodiments of the present disclosure, when the temperature ranges from 15° C. to 35° C., the viscosity of the first adhesive layer 70 is greater than 700 gf/inch, which can ensure that the viscosity of the first adhesive layer 70 at normal temperature can adhere the protective layer 60 and the second buffer layer 30.

It should be noted that 700 gf/inch represents that a weight of 700 g is borne per inch. If the viscosity of the first adhesive layer 70 is greater than 700 gf/inch, it represents that the protective layer 60 and the second buffer layer 30 can only be disassembled when the first adhesive layer 70 bears a weight greater than 700 g per inch.

In the embodiments of the present disclosure, when the temperature ranges from 15° C. to 35° C., the creep coefficient of the first adhesive layer 70 is greater than 300%. That is, the first adhesive layer 70 is easily deformed, which facilitates the bending of the cover plate 100.

In the embodiments of the present disclosure, when the temperature ranges from 15° C. to 35° C., the restitution coefficient of the first adhesive layer 70 is greater than 80%. After the first adhesive layer 70 is bent, the first adhesive layer 70 can restore to the original shape.

In the embodiments of the present disclosure, when the temperature is lower than –50° C. the viscosity of the first adhesive layer 70 is less than 30 gf/inch.

In the embodiments of the present disclosure, when the protective layer 60 is damaged and the protective layer 60 and the second buffer layer 30 need to be disassembled, the cover plate 100 is placed in an environment with a temperature lower than –50° C. for disassembly. At this time, the viscosity of the first adhesive layer 70 is less than 30 gf/inch and the viscosity is relatively weak, which is convenient for disassembling the protective layer 60 and the second buffer layer 30.

The cover plate 100 shown in FIG. 4 includes the first buffer layer 20, the substrate 10, the second buffer layer 30, the first elastic layer 40, the first support layer 50, and the first adhesive layer 70 and the protective layer 60 laminated in sequence. In this case, the first adhesive layer 70 is configured to adhere the protective layer 60 and the first support layer 50.

Figure 5:
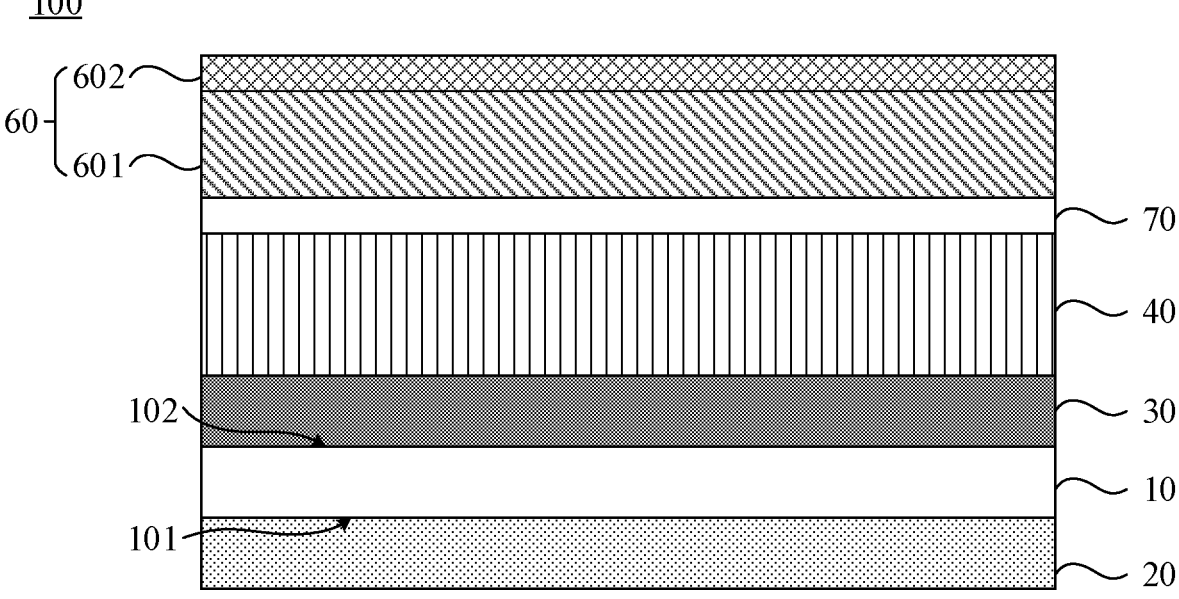
FIG. 5 is a schematic sectional diagram of a cover plate according to some embodiments of the present disclosure.

FIG. 5 is a schematic sectional diagram of a cover plate according to some embodiments of the present disclosure. Referring to FIG. 5, the cover plate 100 includes the first buffer layer 20, the substrate 10, the second buffer layer 30, the first elastic layer 40, the first adhesive layer 70) and the protective layer 60 laminated in sequence. In this case, the first adhesive layer 70 is configured to adhere the protective layer 60 and the first elastic layer 40.

Figure 6:
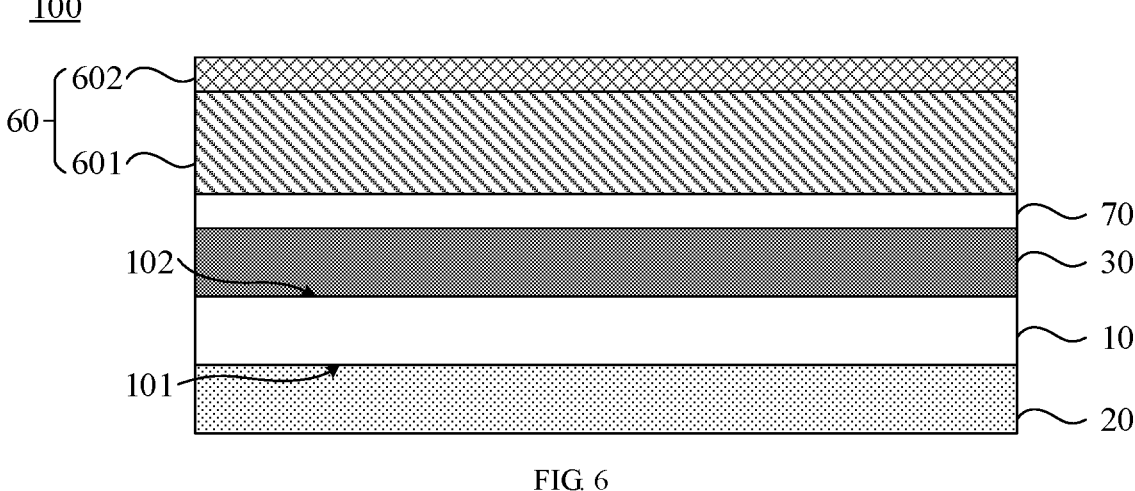
FIG. 6 is a schematic sectional diagram of a cover plate according to some embodiments of the present disclosure.

FIG. 6 is a schematic sectional diagram of a cover plate according to some embodiments of the present disclosure. Referring to FIG. 6, the cover plate 100 includes the first buffer layer 20, the substrate 10, the second buffer layer 30, the first adhesive layer 70 and the protective layer 60 laminated in sequence. In this case, the first adhesive layer 70 is configured to adhere the protective layer 60 and the second buffer layer 30.

Figure 7:
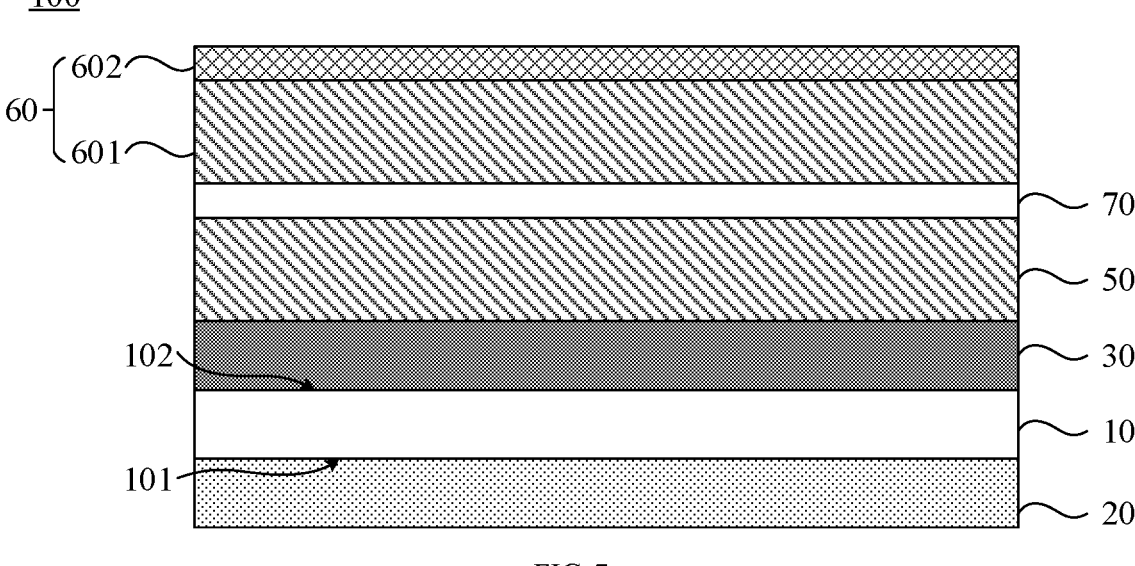
FIG. 7 is a schematic sectional diagram of a cover plate according to some embodiments of the present disclosure.

FIG. 7 is a schematic sectional diagram of a cover plate according to some embodiments of the present disclosure. Referring to FIG. 7, the cover plate 100 includes the first buffer layer 20, the substrate 10, the second buffer layer 30, the first support layer 50, the first adhesive layer 70 and the protective layer 60 laminated in sequence. In this case, the first adhesive layer 70 is configured to adhere the protective layer 60 and the first support layer 50.

Referring to FIG. 4 to FIG. 7 again, the protective layer 60 includes a second support layer 601 and a scratch-resistant layer 602. The second support layer 601 is laminated on the side of the first adhesive layer 70 away from the substrate 10, and the scratch-resistant layer 602 is laminated on the side of the second support layer 601 away from the substrate 10.

In the embodiments of the present disclosure, the protective layer 60 includes the second support layer 601 and the scratch-resistant layer 602. The second support layer 601 has relatively strong rigidity, which can increase the supportability of the cover plate 100, and ensure the shape of the cover plate 100. The scratch-resistant layer 602 has relatively strong hardness, which can avoid the surface of the cover plate 100 from being scratched. Moreover, the protective layer 60 can also have better scratch resistance, stronger pencil hardness, bigger water drop angle and the like.

In the embodiments of the present disclosure, the second support layer 601 is a PET layer. The PET has relatively strong rigidity, which can ensure the rigidity of the second support layer 601.

In the embodiments of the present disclosure, the thickness of the second support layer 601 ranges from 45 μm to 75 μm in the direction perpendicular to the first surface 101, which can not only ensure the strength of the second support layer 601 but also avoid the thickness of the cover plate 100 from being increased due to the large thickness of the second support layer 601. In some embodiments, the thickness of the second support layer 601 is 60 μm.

In the embodiments of the present disclosure, the scratch-resistant layer 602 is referred to as a hard coating (HC) layer.

In the embodiments of the present disclosure, the thickness of the scratch-resistant layer 602 ranges from 3 μm to 10 μm in the direction perpendicular to the first surface 101, which can not only ensure the hardness of the scratch-resistant layer 602 but also avoid the thickness of the protective layer 60 from being increased due to the large thickness of the scratch-resistant layer 602. In some embodiments, the thickness of the scratch-resistant layer 602 is 5 μm.

FIG. 8 is a flowchart of a method for manufacturing a cover plate according to some embodiments of the present disclosure. Referring to FIG. 8, the method includes the following steps.

In step 201, a substrate is provided.

In some embodiments, the substrate is ultra-thin glass.

In step 202, a first buffer layer is formed on a first surface of the substrate.

In step 203, a second buffer layer is formed on a second surface of the substrate.

In the embodiments of the present disclosure, the first buffer layer and the second buffer layer are both polymer material layers and have adhesiveness, and the first buffer layer and the second buffer layer are directly adhered to the first surface and the second surface of the substrate, respectively.

Optionally, the method further includes the following steps.

In step 204, a first elastic layer is formed on a side of the second buffer layer away from the substrate.

In some embodiments, the second buffer layer and the first elastic layer have adhesiveness, and the first elastic layer is adhered to the side of the second buffer layer away from the substrate.

In step 205, a first support layer is formed on a side of the first elastic layer away from the second buffer layer.

In some embodiments, the first support layer is adhered to the side of the first elastic layer away from the second buffer layer.

In step 206, a protective layer is formed on a side of the first support layer away from the first elastic layer.

In some embodiments, the side of the first support layer away from the first elastic layer is coated with a liquid adhesive, then the protective layer is attached on the adhesive, a first adhesive layer is formed after the adhesive is cured, and the first support layer and the protective layer are adhered together to form a cover plate.

FIG. 9 is a schematic sectional diagram of a display device according to some embodiments of the present disclosure. Referring to FIG. 9, the display device includes a cover plate 100 and a flexible display panel 200 laminated in sequence. The cover plate 100 is the cover plate 100 shown in any one of FIG. 1 to FIG. 7.

In the embodiments of the present disclosure, the first buffer layer 20 is disposed on the first surface 101 of the substrate 10, and the second buffer layer 30 is disposed on the second surface 102 of the substrate 10. When the two surfaces of the cover plate 100 are impacted, the first buffer layer 20 and the second buffer layer 30 can deform to absorb stress, so as to protect the substrate 10, thereby increasing the strength of the cover plate 100 and reducing the possibility of damage to the cover plate 100. The elastic modulus of the first buffer layer 20 ranges from 10 MPa to 2 GPa, that is, the first buffer layer 20 has relatively good elasticity. The first surface 101 faces the flexible display panel, that is, the first buffer layer 20 with relatively good elasticity faces the flexible display panel. Therefore, the protection effect of the first buffer layer 20 on the flexible display panel can be increased. The elastic modulus of the second buffer layer 30 ranges from 60 MPa to 7 GPa, that is, the second buffer layer 30 has relatively good rigidity, such that the second buffer layer 30 has relatively strong strength. Thus, when the cover plate 100 is impacted, the amount of strain transferred to the substrate 10 is reduced, and the possibility of damage to the cover plate 100 is further reduced.

In the embodiments of the present disclosure, the flexible display panel 200 is an organic light-emitting diode (OLED) display panel.

Figure 10:
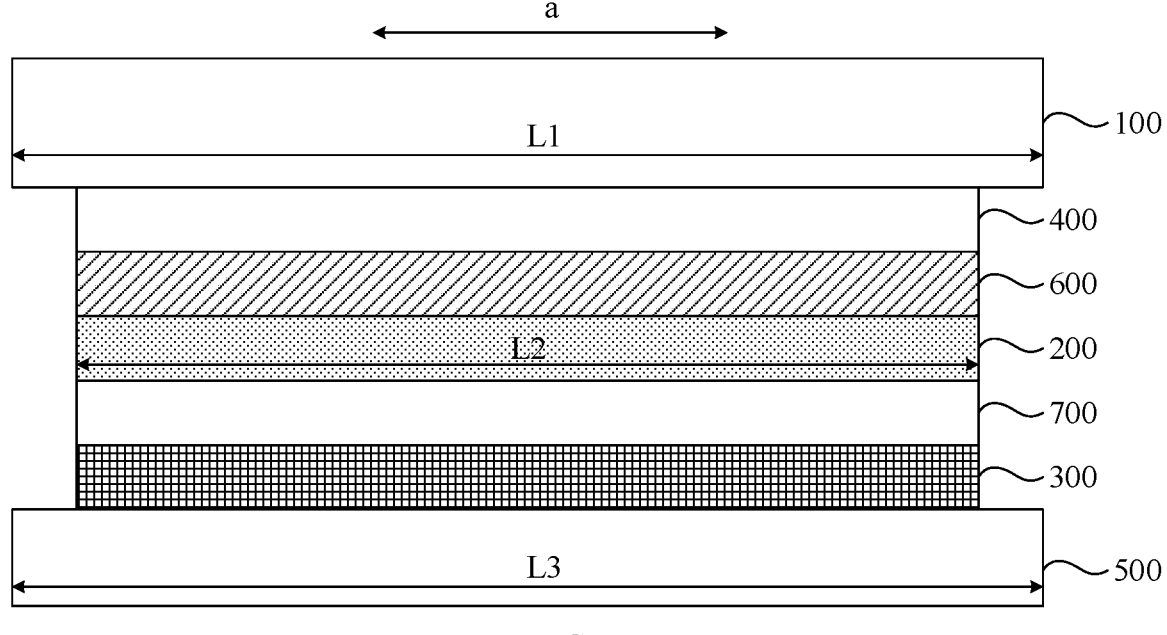
FIG. 10 is a schematic sectional diagram of a display device according to some embodiments of the present disclosure.

FIG. 10 is a schematic sectional diagram of a display device according to some embodiments of the present disclosure. Referring to FIG. 10, the display device further includes a second elastic layer 300, and the second elastic layer 300 is laminated on the side of the flexible display panel 200 away from the cover plate 100.

In the embodiments of the present disclosure, the second elastic layer 300 is disposed on the side of the flexible display panel 200 away from the cover plate 100, that is, the second elastic layer 300 and the cover plate 100 are disposed on two opposite sides of the flexible display panel 200. The second elastic layer 300 and the cover plate 100 protect the flexible display panel 200 from two sides of the flexible display panel 200, respectively. Both the second elastic layer 300 and the cover plate 100 have elasticity. Therefore, when the display device is impacted, both the second elastic layer 300 and the cover plate 100 can deform to protect the flexible display panel 200, thereby reducing the possibility of damage to the display device, and reducing the possibility of damage to the display device when a pen drop test or ball drop test is conducted on the display device. In addition, the second elastic layer 300 can also play a light-shielding function.

In the embodiments of the present disclosure, in the case that the display device is a bendable display device, during the bending process, the second elastic layer 300 has good elasticity and can also play a role of absorbing the dislocation amount of film layers, thereby reducing the possibility that the flexible display panel 200 falls off or breaks.

In an implementation of the embodiments of the present disclosure, the tensile strength of the second elastic layer 300 ranges from 5 MPa to 10 MPa.

In the embodiments of the present disclosure, the tensile strength of the second elastic layer 300 is set to range from 5 MPa to 10 MPa to ensure the elasticity of the second elastic layer 300. In some embodiments, the tensile strength of the second elastic layer 300 is 8 MPa.

In an implementation of the embodiments of the present disclosure, the second elastic layer 300 is any one of a TPU elastomer rubber layer, a foam layer, a PET layer, a PI layer, and an OCA layer.

In the embodiments of the present disclosure, the TPU elastomer rubber, foam, PET, PI, and OCA all have elasticity, which can ensure the elasticity of the second elastic layer 300.

In another implementation of the embodiments of the present disclosure, the second elastic layer 300 is formed by laminating at least two of the TPU elastomer rubber layer, the foam layer, the PET layer, the PI layer, and the OCA layer.

In some embodiments, the second elastic layer 300 is formed by laminating the TPU elastomer rubber layer, the foam layer and the PET layer.

In an implementation of the embodiments of the present disclosure, the thickness of the second elastic layer 300 ranges from 5 μm to 30 μm in the direction perpendicular to the first surface 101, which can not only ensure the strength of the second elastic layer 300 but also avoid the thickness of the display device form being increased due to the large thickness of the second elastic layer 300. In some embodiments, the thickness of the second elastic layer 300 is 20 μm.

Referring to FIG. 10 again, along the first direction a, the length L1 of the cover plate 100 is greater than the length L2 of the flexible display panel 200. The first direction a is perpendicular to an extension direction of a bending line when the display device is bent, and the first direction a is parallel to the first surface 101.

In the embodiments of the present disclosure, the length L1 of the cover plate 100 is greater than the length L2 of the flexible display panel 200, such that the side surfaces of the flexible display panel 200 can be protected from damages caused by bumps during the assembly process.

In the embodiments of the present disclosure, the second elastic layer 300 and the flexible display panel 200 are integrally cut, so the length of the second elastic layer 300 is equal to the length of the flexible display panel 200. The cover plate 100 is adhered to the flexible display panel 200 through a second adhesive layer 400.

In an implementation of the embodiments of the present disclosure, the thickness of the second adhesive layer 400 ranges from 25 μm to 100 μm in the direction perpendicular to the first surface 101, which can avoid the thickness of the display device from being increased due to the large thickness of the second adhesive layer 400. In some embodiments, the thickness of the second adhesive layer 400 is 50 μm.

In the embodiments of the present disclosure, the second adhesive layer 400 is an OCA layer. The OCA has relatively good adhesiveness, which can ensure the firmness of connection between the cover plate 100 and the flexible display panel 200.

Alternatively, in other implementations, the second adhesive layer 400 is a PSA layer.

Referring to FIG. 10 again, the display device further includes a support plate 500. The support plate 500 supports the second elastic layer 300 and the flexible display panel 200 to ensure the shape of the display device.

In the embodiments of the present disclosure, the elastic modulus of the support plate 500 is greater than 700 MPa, and the tensile strength of the support plate 500 is greater than 1000 MPa, which can ensure the strength and support-ability of the support plate 500.

In the embodiments of the present disclosure, in the case that the display device is a bendable display device, the bending region of the support plate 500 is patterned such that the bending region of the support plate 500 is hollowed-out. In this way, the stress can be relieved during the bending process to facilitate the bending of the support plate 500 and the support plate 500 has a smaller bending radius.

In the embodiments of the present disclosure, the support plate 500 is a stainless steel plate, an aluminum alloy plate, or a titanium alloy plate.

In an implementation of the embodiments of the present disclosure, the thickness of the support plate 500 ranges from 20 μm to 200 μm in the direction perpendicular to the first surface 101, which can not only ensure the strength and supportability of the support plate 500 but also avoid the thickness of the display device from being increased due to the large thickness of the support plate 500. In some embodiments, the thickness of the support plate 500 is 100 μm.

Referring to FIG. 10 again, the display device further includes a polarizer (pol) 600, and the polarizer 600 is disposed between the flexible display panel 200 and the cover plate 100.

In an implementation of the embodiments of the present disclosure, the thickness of the polarizer 600 ranges from 40 μm to 100 μm. In some embodiments, the thickness of the polarizer 600 is 50 μm.

Referring to FIG. 10 again, the display device further includes a back film (BF) 700, and the back film 700 is disposed between the flexible display panel 200 and the support plate 500.

In an implementation of the embodiments of the present disclosure, the thickness of the back film 700 ranges from 5 μm to 100 μm. In some embodiments, the thickness of the back film 700 is 50 μm.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A cover plate, wherein the cover plate is applicable to a flexible display panel, the cover plate comprising:
 a substrate comprising a first surface and a second surface opposite to each other, the first surface facing the flexible display panel;
 a first buffer layer laminated on the first surface; and
 a second buffer layer laminated on the second surface
 wherein the cover plate further comprises:
 a first elastic layer laminated on a side of the second buffer layer away from the substrate;
 a first support layer laminated on a side of the first elastic layer away from the substrate;
 a protective layer laminated on the side of the second buffer layer away from the substrate, wherein the protective layer is an outermost layer among all layers on the side of the second buffer layer away from the substrate; and
 a first adhesive layer adhered between the protective layer and a layer adjacent to the protective layer,
 wherein the protective layer comprises:
 a second support layer laminated on a side of the first adhesive layer away from the substrate; and
 a scratch-resistant layer laminated on a side of the second support layer away from the substrate,
 wherein when temperature ranges from 15° C. to 35° C., a viscosity of the first adhesive layer is greater than 700 gf/inch, a creep coefficient of first adhesive layer is greater than 300%, and a restitution coefficient of the first adhesive layer is greater than 80%; and
 when the temperature is less than −50° C., the viscosity of the first adhesive layer is less than 30 gf/inch, wherein the first adhesive layer is a pressure-sensitive adhesive layer.

2. The cover plate according to claim 1, wherein
 the first buffer layer is any one of a flexible polyurethane (PU) layer, a polyimide (PI) layer, and a polymethyl methacrylate (PMMA) layer, or the first buffer layer is formed by laminating at least two of the flexible PU layer, the PI layer and the PMMA layer; and
 the second buffer layer is any one of the flexible PU layer, the PI layer and the PMMA layer, or the second buffer layer is formed by laminating at least two of the flexible PU layer, the PI layer and the PMMA layer.

3. The cover plate according to claim 1, wherein in a direction perpendicular to the first surface, a thickness of the first buffer layer ranges from 5 μm to 40 μm, and a thickness of the second buffer layer ranges from 5 μm to 40 μm.

4. The cover plate according to claim 1, wherein the first elastic layer is a thermoplastic polyurethane (TPU) layer.

5. The cover plate according to claim 1, wherein the first support layer is a polyethylene terephthalate (PET) layer.

6. A display device, comprising a cover plate and a flexible display panel laminated in sequence, wherein the cover plate is applicable to the flexible display panel, and comprises:

a substrate comprising a first surface and a second surface opposite to each other, the first surface facing the flexible display panel;

a first buffer layer laminated on the first surface; and a second buffer layer laminated on the second surface, wherein the cover plate further comprises:

a first elastic layer laminated on a side of the second buffer layer away from the substrate, wherein the cover plate further comprises:

a first elastic layer laminated on a side of the second buffer layer away from the substrate;

a first support layer laminated on a side of the first elastic layer away from the substrate;

a protective layer laminated on the side of the second buffer layer away from the substrate, wherein the protective layer is an outermost layer among all layers on the side of the second buffer layer away from the substrate; and a first adhesive layer adhered between the protective layer and a layer adjacent to the protective layer, wherein the protective layer comprises:

a second support layer laminated on a side of the first adhesive layer away from the substrate; and a scratch-resistant layer laminated on a side of the second support layer away from the substrate, wherein when temperature ranges from 15° C. to 35° C., a viscosity of the first adhesive layer is greater than 700 gf/inch, a creep coefficient of first adhesive layer is greater than 300%, and a restitution coefficient of the first adhesive layer is greater than 80%; and when the temperature is less than −50° C., the viscosity of the first adhesive layer is less than 30 gf/inch, wherein the first adhesive layer is a pressure-sensitive adhesive layer.

7. The display device according to claim 6, further comprising:

a second elastic layer laminated on a side of the flexible display panel away from the cover plate, wherein a tensile strength of the second elastic layer ranges from 5 MPa to 10 MPa.

8. The display device according to claim 7, wherein the second elastic layer is any one of a thermoplastic polyurethane (TPU) elastomer rubber layer, a foam layer, a polyethylene terephthalate (PET) layer, a polyimide (PI) layer, and an optically clear adhesive (OCA) layer; or the second elastic layer is formed by laminating at least two of the (TPU) elastomer rubber layer, the foam layer, the (PET) layer, the PI layer, and the OCA layer.

9. The display device according to claim 6, wherein along a first direction, a length of the cover plate is greater than a length of the flexible display panel, the first direction being perpendicular to an extension direction of a bending line when the display device is bent, and the first direction being parallel to the first surface.

10. The display device according to claim 6, wherein the first buffer layer is any one of a flexible polyurethane (PU) layer, a polyimide (PI) layer, and a polymethyl methacrylate (PMMA) layer, or the first buffer layer is formed by laminating at least two of the flexible PU layer, the PI layer and the PMMA layer; and the second buffer layer is any one of the flexible PU layer, the PI layer and the PMMA layer, or the second buffer layer is formed by laminating at least two of the flexible PU layer, the PI layer and the PMMA layer.

11. The display device according to claim 6, wherein in a direction perpendicular to the first surface, a thickness of the first buffer layer ranges from 5 µm to 40 µm, and a thickness of the second buffer layer ranges from 5 µm to 40 µm.

12. The display device according to claim 6, wherein the first elastic layer is a thermoplastic polyurethane (TPU) layer.

13. The display device according to claim 6, wherein the first support layer is a polyethylene terephthalate (PET) layer.

* * * * *